United States Patent [19]

Curtis

[11] Patent Number: 5,326,669
[45] Date of Patent: Jul. 5, 1994

[54] PHOTOSENSITIVE COMPOSITIONS
[75] Inventor: John Curtis, Princeton, N.J.
[73] Assignee: Ulano Corporation, Brooklyn, N.Y.
[21] Appl. No.: 878,239
[22] Filed: May 4, 1992
[51] Int. Cl.$^5$ ............................ G03C 1/73; C08F 8/00
[52] U.S. Cl. ............................ 430/283; 430/287; 430/909; 430/281; 525/59; 525/61
[58] Field of Search ............ 525/59, 61; 430/287, 430/909, 906, 281, 270, 283; 522/149

[56] References Cited

U.S. PATENT DOCUMENTS

| T871,009 | 2/1970 | Borden et al. | 96/105 |
| 2,811,510 | 10/1957 | Leubner et al. | 260/67.5 |
| 2,908,667 | 10/1959 | Williams | 260/79.3 |
| 3,737,319 | 6/1973 | Borden | 96/115 R |
| 5,061,603 | 10/1991 | Hamilton et al. | 430/287 |
| 5,206,113 | 4/1993 | Mueller-Hess et al. | 430/270 |

FOREIGN PATENT DOCUMENTS 1271121 7/1968 Fed. Rep. of Germany .
67702 4/1983 Japan .

OTHER PUBLICATIONS

Ichimura et al. J. Polym. Sci. Polym. Chem. Ed., 20, 1419–1432 (1982).

*Primary Examiner*—Marion E. McCamish
*Assistant Examiner*—Rosemary Ashton
*Attorney, Agent, or Firm*—Charles E. Baxley

[57] ABSTRACT

A photosensitive polymer composition comprising a compound of the structure

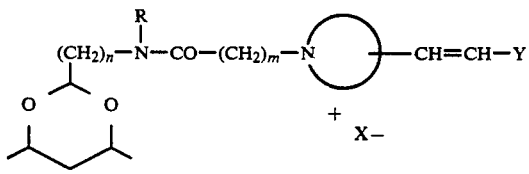

wherein

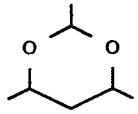

is a polyvinyl acetal,
n is an integer from 1 to 6,
R is hydrogen or alkyl,
m is an integer from 1 to 6,
X is an anion,

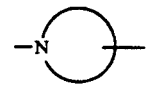

is a divalent radical having the structure

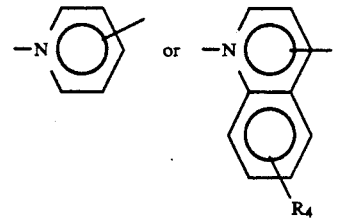

Y is a monovalent radical having the structure

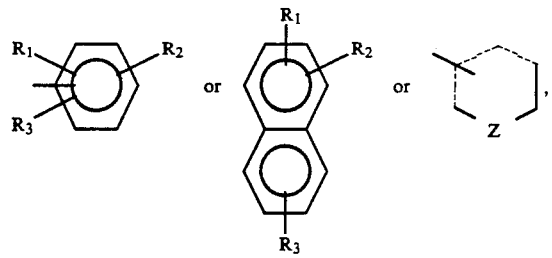

(Abstract continued on next page.)

where
is a 5 or 6 membered heterocyclic ring in which Z is nitrogen, substituted nitrogen, oxygen or sulfur, and $R_1$, $R_2$, $R_3$ and $R_4$ are hydrogen, alkyl, alkenyl, alkoxy, aralkyl, substituted alkyl, substituted alkoxy, carboxy, carboxy ester, amino, substituted amino, amido, substituted amid, cyano, hydroxy, nitro, isocyanato, sulphonyl halide, sulphonic acid as halide, and may be the same or different or $R_1$ taken together with $R_2$ is methylenedioxy.

12 Claims, No Drawings

PHOTOSENSITIVE COMPOSITIONS

THE PRIOR ART

Photosensitive resists can be suitable for a wide variety of uses, including the preparation of several types of printing forms, including screen printing resists, printing plates and resists for the preparation of various stages of circuit board manufacture, as well as UV curable inks and overprint varnishes.

Water soluble or water processable photoresist materials have several advantages, encompassing such aspects as safety in handling, cost, and ease of processing after exposure. Additionally, water soluble or water swellable photopolymer materials can be used in such diverse applications as the manufacture of color and black and white TV screens, and the immobilization of enzymes or living micro organisms. In the last mentioned application, it is an absolute necessity to utilize innocuous materials to prevent damage or destruction of the material under investigation during the immobilization stage.

Water processable systems that have previously been used in one or more applications mentioned above are as follows:

a) Dichromate sensitized water soluble colloids. The use of these materials is diminishing, due to their reliance on toxic metal salts which present severe safety and effluent handling problems as well as the limited shelf life that their "dark reaction" brings to the system.

b) Diazo resins. These are usually diazodiphenylamine/formaldehyde condensation products; they are often utilized in metal free form, and when mixed with a water soluble colloid such as polyvinyl alcohol, can produce excellent results. However, they are somewhat unstable, with a limited shelf-life (especially under warm moist conditions), and their photographic speed is rather SLOW.

c) Free radical initiated systems. These consist of an initiator capable of forming free radicals when irradiated with actinic light, one or more unsaturated monomers or oligomers that contain vinyl unsaturation, and a water soluble colloid. These systems have a double disadvantage of being both oxygen and moisture sensitive, which can lead to exposure speed variations. They can also be heat sensitive and polymerize when stored at elevated temperatures.

d) Photodimerizable materials. These have the advantage of being fast exposing, and unaffected by moisture, oxygen and heat. The water insoluble variety is best characterized by polyvinylcinnamate.

Water soluble resins based on a styrylpyridinium salt, possessing a formyl or acetal group which is utilized to react with polyvinyl alcohol and so produce a photopolymer that contains Photodimerizable substituents along the polymer chain, have been described, as have chalcone derivatives similarly attached to polyvinyl alcohol. The stilbene derivatives are usually more efficient than the chalcone types.

Photopolymers described in U.S. Pat. Nos. 4,339,524; 4,564,580, 4,272,620 and as well as European Patents 0 313 220 and 0 373 537 utilize a stilbazolium quaternary based system. However, the connection point to the polyvinyl alcohol is via a formyl or acetal grouping attached to the styryl entity. This severely restricts the capability to modify the absorption characteristics of the chromophore, and hence, all photopolymer compositions within the "family." The styryl grouping makes such a major contribution to the absorption characteristics of the overall molecule, that having to restrict that component of the chromophore by using it as a connecting point to the colloid, drastically limits what advantageous substituents can be incorporated in that part of the molecule. It also places a very severe restriction as to what raw materials can effectively (and practically) be utilized to prepare a photosensitive resins of the particular type described by the aforementioned patents.

In the aforementioned U.S. and Euro patents the photodimerisable entity is usually converted into a salt form to endow the material with additional advantageous properties. However, the compounds disclosed in these patents are structurally very restrictive with regard to freedom of substitution, so they do not allow for the preparation of compounds having a wide range of desirable properties with respect to absorption, activity, solubility and cost.

THE PRESENT INVENTION

The present invention relates to a particular family of photopolymers that possess a high degree of photosensitivity as well as marked solubility in water.

In accordance with the present invention there are provided photosensitive polymer compounds of the structure:

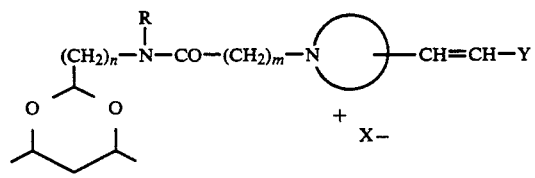

wherein

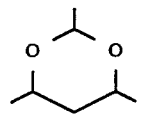

is a polyvinyl alcohol acetal, n is an integer from 1 to 6, preferably 1, R is hydrogen or alkyl, m is an integer from 1 to 6, preferably 1 to 3, X is an anion,

is a divalent radical having the structure

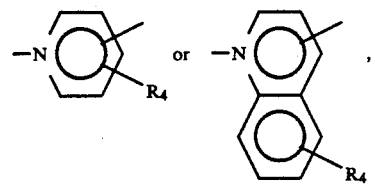

Y is a monovalent radical having the structure

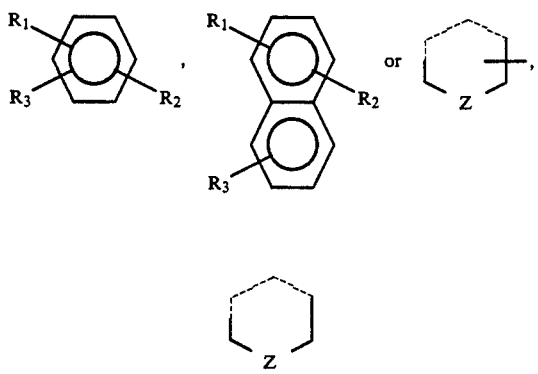

where is a 5 or 6 membered heterocyclic ring in which Z is nitrogen, substituted nitrogen, oxygen or sulfur, and $R_1$, $R_2$, $R_3$ and $R_4$ are selected hydrogen, alkyl, alkenyl, alkoxy, aralkyl, substituted alkyl, substituted alkoxy, carboxy, carboxy ester, amino, substituted amino, amido, substituted amido, cyano, hydroxy, nitro isocyanato, sulphonyl halide, sulphonic acid, or halide and may be the same or different, or $R_1$ and $R_2$ may be joined to form methylenedioxy, ethylenedioxy, and the like.

The anion is preferably inorganic and more preferably is halogen.

The alkyl groups in alkyl and alkyl containing groups such as for example, alkoxy and alkylamino preferably contains from 1 to 6 carbon atoms. The alkenyl groups preferably contain from 1 to 6 carbon atoms.

Representative compounds of this invention include compounds of the structure

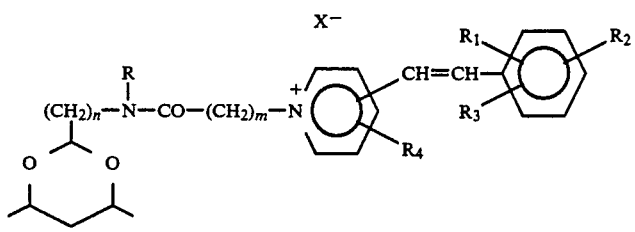

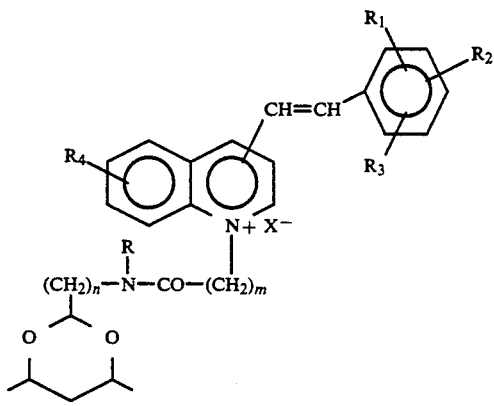

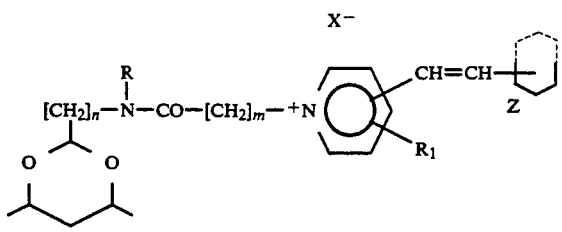

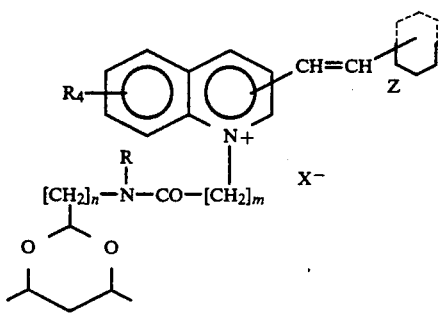

-continued

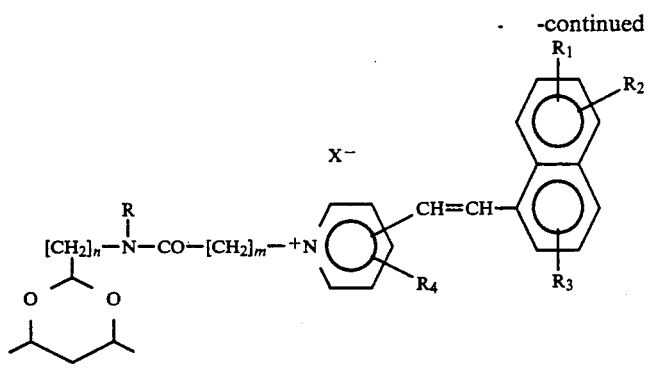

and:

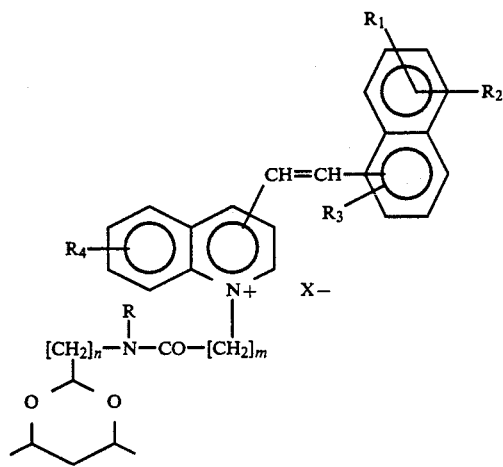

where R, R₁, R₂, R₃, R₄ X, m, n and

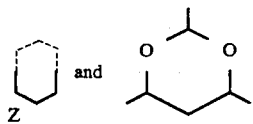

are the same as above.

These compounds can be readily obtained by heating an acidic aqueous solution of polyvinyl alcohol with a compound of the formula

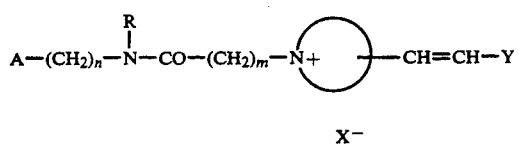

where A is a formyl or acetal group and the remaining structures are as defined above.

The term "polyvinyl alcohol" refers to a saponified vinyl acetate polymer having a saponification degree of 70 to 99 mol %. Thus, if the starting vinyl acetate polymer is a homopolymer of vinyl acetate the content of the vinyl alcohol units is 70 to 99 mol %; i.e. a vinyl alcohol polymer having a vinyl alcohol content of 70 to 99 mol %. Accordingly, the content of the monomer copolymerizable with vinyl acetate, which constitutes the vinyl acetate polymer is restricted so that the above-mentioned value of the saponification can be given. It is preferred that the polymerization degree of the vinyl acetate polymer be from 300 to 3,000.

The above described intermediates used in the preparation of the polymeric products are conveniently prepared from readily available inexpensive bulk chemicals. For example, the reaction may be carried out as follows:

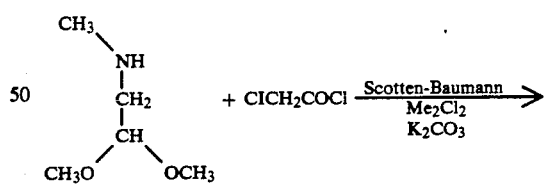

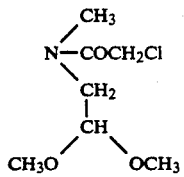

The resultant acetal contains a highly active chloro group, activated by the adjacent amide carbonyl. It is therefore a good "leaving" group and the subsequent salt forming reaction with a styryl base is very straightforward and easy.

A specific example of the reaction is as follows:

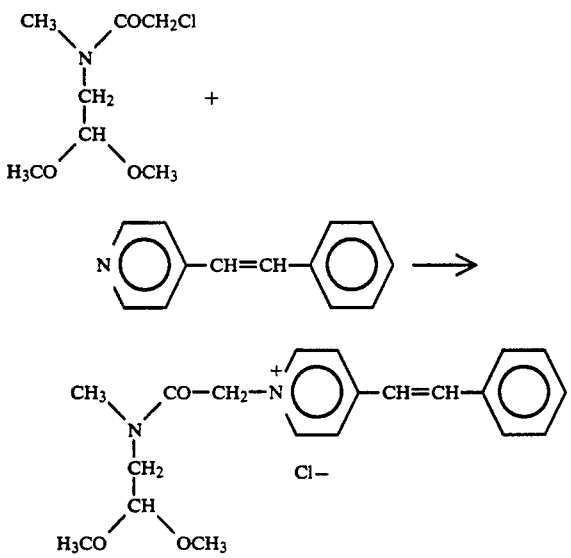

In addition to being able to easily mix the photodimerizable entities, the photopolymer can be further modified by the addition of non-light sensitive co-reactants during the condensation with polyvinyl alcohol to change the properties of adhesion, solubility, or resistance to solvents or water. Examples of such non-light sensitive co-reactants are acetaldehyde, its dialkyl acetal, chloroacetal dehyde dialkyl acetals, methylaminoacetal dehyde dimethyl acetal, propionaldehyde, sulfobenzaldehyde, dialkylamino benzaldehydes and glyoxyllic acid etc. The polyvinyl alcohol may be any partially or fully hydrolysed grade, and the photopolymers can be prepared by reacting the photodimerizable salt form of the styryl base in an aqueous solution of the polyvinyl alcohol in the presence of an acid catalyst. The reaction is usually carried out at a pH of around 2.0 using hydrochloric, sulfuric, phosphoric or an organic sulphonic acid. The reaction is usually carried out at about 70° C. for a period of 4–8 hours.

However, the time and temperature can be varied a great deal, if required. The photopolymer may be separated by precipitation in a suitable non solvent (e.g., acetone), used directly, or after the pH has been ameliorated by use of an ion exchange resin etc.

The current invention is particularly advantageous in that it allows the entire chromophore to be easily substituted with any group or number of groupings that can advantageously affect the absorption, solubility, activity or even cost of the photopolymer material. In the aforementioned U.S. and Euro patents the photodimerizable entity is converted into a salt form to endow the material with additional advantageous properties, the present invention makes use of a "connecting" entity (one that can react with polyvinyl alcohol) that forms a quaternary salt with the substituted styryl base. This permits freedom of substitution in the styryl ring, in fact the entire chromophore, permitting choice of absorption, activity, solubility and cost. Furthermore it is a simple process to isolate two or more derivatives with very different absorption characteristics and combine them to provide a broader spectrum sensitive product, increasing exposure speed with a wide variety of different exposure sources. The aforementioned patents are very restricted by comparison. The present invention affords water solubility by salt formation, where the entity that makes the salt is also the connecting point to the colloid.

Additionally, for the efficiency of the photoreaction, it is highly desirable that the exposed species (the entity remaining after the photo destruction of the chromophore) does not absorb a similar wavelength to the photoactive chromophore, and that the photoactive chromophore is rapidly destroyed by actinic light. This prevents the surface layer from self-screening or showing a "filtering" effect on the underlying layers.

The photopolymers characterized by the present invention have a very high photoefficiency, allowing thick layers of the photopolymer material to be hardened throughout the entire thickness of the coating, even with a relatively short exposure time to light of a suitable wavelength. They display a faster photospeed than diazo or other systems as described previously. The mechanism of cross-linking in this particular patent is by photodimerisation, and hence none of the photopolymers characterized by the patent, exhibit the susceptibility to oxygen, moisture and temperature of some other systems.

The photodimerizable chromophore need only be present in low concentration, less than 5 mol% based on the polyvinyl alcohol colloid, in order to provide high levels of photosensitivity. Consequently, many of the admirably properties of polyvinyl alcohol (its resistance to a very wide range of solvents, and its ease of degradation with low concentration of an aqueous solution of metaperiodate or bleach) are retained. The photopolymers described in the present invention are suitable for a very wide range of applications, and can be used in both photographic and photochemical processes where a resist, stencil or relief image is required, for example, as an etching resist for printing plates, and cylinders, name plates, dials, etc.: as resists for plating processes (preparation of printed circuit boards), as ink accepting images for lithographic plates, and as stencils for screen printing stencils. They may also be used in the preparation of photomasks for cathode ray tubes as used in both black and white and color television sets. They can also find use in the preparation of specialized water-based UV curable inks. As previously mentioned, the photopolymers characterized by the present invention can be very easily modified to cover a previously unprecedented range of wavelengths, making them suitable for use with a variety of different laser devices such as used in the direct scanning of lithographic printing plates.

The invention will become clearer from the examples which follow. These examples are given by way of illustration and are not to be considered as limiting.

EXAMPLE 1

N- 2-Dimethoxyethyl-N-methyl-chloro-acetamide

To a solution of 168 g. anhydrous potassium carbonate in 200 cc water were added with stirring:

| | |
|---|---|
| Methylamino-dimethyl acetal | 144 g. |
| Ice | 400 g. |
| Methylene chloride | 400 g. |
| A surfactant-triethylamine salt of dodecylphenyl-sufonic acid (60% aqu. solution) | 2 g. |

To the resultant dispersion was added dropwise with stirring over a period of 30 minutes, a solution of:

| | |
|---|---|
| Chloroacetyl chloride | 142 g. |
| Methylene chloride | 100 g. |

During the addition 400 g. of ice was added portionwise to keep the reaction temperature below 5° C.

The stirring was continued for thirty (30) minutes after the addition was completed allowing the reaction mixture to reach ambient temperature. The organic layer was separated and the aqueous layer extracted three times with methylene chloride. The extracts and organic layer were combined and treated with activated carbon which was then removed by filtration. The organic solvent (methylene chloride) was removed under vacuum in a rotary evaporator leaving 234 g. of product as a pale yellow oil.

EXAMPLE 2

4-( 4-Methoxystyryl) -pyridine

A mixture containing:

| | |
|---|---|
| 4-Picoline | 38 g. |
| 4-Anisaldehyde | 55 g. |
| Xylene | 400 g. |
| Dimethylformamide | 32 g. |
| p-Toluene-sulfonic acid | 32 g. | was stirred under reflux for 24 hours using a Dean & Stark apparatus to remove water formed during the reaction. About 250 cc. of xylene/dimethylformamide were then removed by distillation. The residue was cooled and hexane then added with stirring. The solid was removed by filtration, washed with hexane, and air-dried. The solid was then dispersed in 1. 1 water and the aqueous dispersion was heated to near boiling 28 g. anhydrous sodium bicarbonate was added portionwise with stirring. The mixture was kept near boiling and stirred for 2 hrs, the pH being checked to ascertain that the pH was alkaline, sodium carbonate being added if needed, and then filtered. The product was washed with water and air dried to yield 74 g. of a pale buff solid.

EXAMPLE 3

N-2-Dimethoxyethyl-N-methylacetamido-4-(3,4-dioxymethylenestyryl)-pyridinium chloride A mixture containing:

| | |
|---|---|
| 4-(3,4-Dioxymethylenestyryl-pyridine | 4.5 g. |
| Ethyl acetate | 40.0 g. |
| N-2-Dimethoxyethyl-N-methyl-Chloroacetamide | 4.2 g. | was stirred under reflux for 24 hours, cooled, filtered and washed with ethyl acetate. The product was air dried to give 6.8 g. of a yellow solid.

EXAMPLE 4

Condensation of N-2-dimethoxyethyl-N-Methylacetamido-4-( 4-chlorostyryl)-pyridinium chloride with polyvinyl alcohol

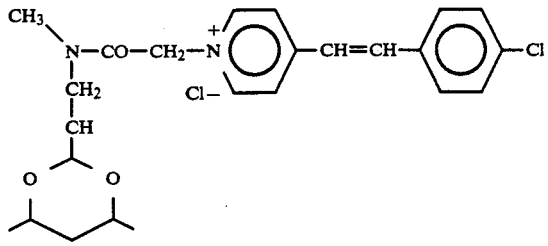

500 cc boiling water were stirred vigorously to produce a good vortex, and 44.0 g. Vinnol brand of polyvinyl alcohol was added carefully to the vortex. Vinnol 540 is 87%–89% saponified polyvinyl acetate having a viscosity of 40–50 cps in a 4% aqueous solution at 20° C. Stirring was continued until a complete solution had formed and the temperature had dropped to around 65°–70° C. 8.0 g. of 85% phosphoric acid was then added followed by the addition of 8.2 g. of N-2-dimethoxyethyl-N-methylacetamido-4- ( 4-chloro styryl) -pyridinium-chloride.

A pale yellow solution quickly formed and stirring was continued at 65°–70° C. for 7 hours (pH was 18) The solution was cooled and water was replaced to provide a 10% w/w solution.

The solution according to Example 4 was coated onto 230 white polyester mesh, dried and exposed through a line test positive to five 2-unit steps (a unit being about 1.2 seconds) on a table top VNH fluorescent tube exposure unit. VNH is an exposure unit with fluorescent bulbs as a light source and is available from VNH Industries, Inc. On development with water, a faithful negative reproduction of the original line positive wash obtained with all exposure steps adhering to the mesh substrate.

Using the procedures given above compounds wherein the pyridine ring is replaced by other N-containing heterocycles may be prepared.

EXAMPLE 5

The procedure of Example 4 was repeated using 300 cc. boiling water and 22.0 g. Vinnol 540. Concentrated hydrochloric acid (1.5 g.) was used in place of the 85% phosphoric acid. The addition of the acid was followed by the addition of 4.1 g. N-2-di-methoxyethyl-N-methylacetamido-4-(4-chloro-styryl )-pyridinium chloride and then 5.0 g. of 50% aqueous glyoxyllic solution. A pale yellow solution formed and the pH dropped to below 2.0. Stirring was continued at about 65°–70° C. for 8 hours and water added to provide a 10% w/w solution.

The solution was coated onto a white polyester mesh base and the coating permitted to dry, then exposed to UV light. The developed, dry film showed increased resistance to water while retaining all the solvent resistance of the unmodified material as well as to the degradability with bleach solution or metaperiodate ions.

EXAMPLE 6

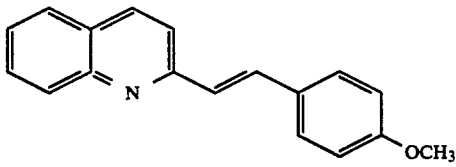

2-[4-Methoxystyryl]-Quinoline

| Quinaldine | 14.3 g. |
|---|---|
| Anisaldehyde | 13.6 g. |
| Xylene | 100.0 g. |
| DMF | 8.0 g. |
| PTSA | 8.0 g. |

Stirred above under reflux, [Dean & Stark conditions], after 2 hours, a yellow/orange solid precipitated, accompanied by frothing and bumping. Continued refluxing for 12 hours, cooled and filtered. Added resultant solid to boiling water, stirred and carefully added sodium carbonate until well alkaline. Continued stirring [at near boiling] for 2 hours, checked still alkaline and filtered. Washed with hot water. Air dried, yellow solid
Yield 16.9 grams.

EXAMPLE 7

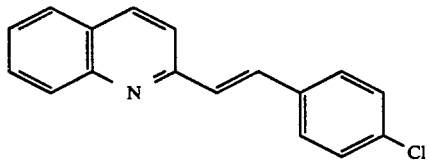

2-[4-Chlorostyryl]-Quinoline

| 4-Chloro-Benzaldehyde | 14.0 g. |
|---|---|
| Quinaldine | 14.3 g. |
| Acetic Anhydride | 18.0 g. |
| Glacial Acetic Acid | 9.0 g. |
| Stirred under reflux for 11 hours, | 1.0 kg. |
| then poured on to: Ice/Water | |
| Stirred and added portionwise: | 15.0 g. |
| Anhydrous Sodium Carbonate | |

Stirred and heated to around 60° C. [PH alkaline], for 45 minutes. Filtered and washed with hot water. Oven dried buff granular solid.
Yield: 25.1 g.

EXAMPLE 8

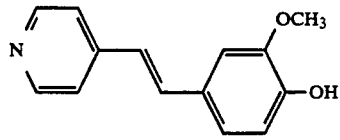

4-[4-Hydroxy-3-Methoxystyryl]-Pyridine

| 4-Picoline | 38.0 g. |
|---|---|
| Vanillin | 61.0 g. |
| Xylene | 400.0 cc |
| DMF | 40.0 cc |
| PTSA | 32.0 g. |

Stirred under reflux [Dean & Stark conditions] for 7 hours, solution becomes completely clear when approximately 7 cc of water has been collected]. The reaction solution then starts to become turbid as the product begins to precipitate. Continued heating and stirring [under Dean & Stark conditions] for the total 7 hours, taking care not to overheat material [some decomposition will occur if the reaction .mix is overheated]. Allowed to stand overnight, filtered, washed with hexane and then dispersed in hot water Stirred and added portionwise to the hot stirred suspension:

| Sodium Carbonate | 10.0 g. |
|---|---|

PH after 2 hours of vigorous stirring was 7 - 3, filtered and washed with hot water. Air dried yellow solid.
Yield: 86.2 g.

EXAMPLE 9

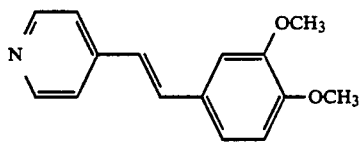

4-[3-4-Dimethoxystyryl]-Pyridine

| 4-Picoline | 28.5 g. |
|---|---|
| 3-4-Dimethoxy-Benzaldehyde | 50.0 g. |
| Xylene | 300 cc |
| DMF | 24 cc |
| PTSA | 24 g. |

Stirred under/reflux for 24 hours, cooled and added hexane with vigorous stirring. Left over night and decanted off all the solvent. Dissolved up sticky solid in approximately 200 cc of hot methanol and poured resultant on to a stirred solution of:

| 8N Caustic Soda | 500 cc |
|---|---|

Stirred for 1 hour, filtered and washed with hot water. Air dried pale brown solid.
Yield: 60.0.

EXAMPLE 10

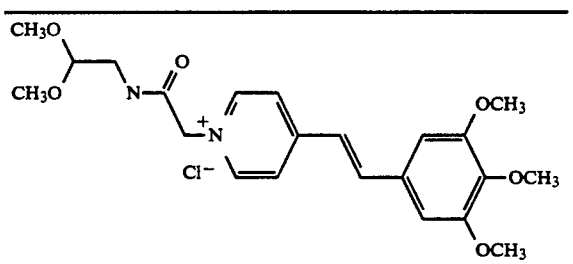

N-2-Dimethoxy-ethyl-N'-Methyl-Acetamido-4-[3-4-5-Trimethoxystyryl]-Pyridinium-Chloride

| 4-[3-4-5-Trimethoxy-Styryl]-Pyridine | 5.4 g |
|---|---|
| Ethyl Acetate | 35.0 cc |
| N-2-Dimethoxy-ethyl-N'-Methyl-Chloracetamide | 4.2 g |

Stirred under reflux for 30 hours, cooled, filtered and washed with ethyl acetate, air dried buff solid.

Yield: 8.8 g.

EXAMPLE 11

4-[4-Chlorostyryl]-Pyridine

| 4-Picoline | 40 g |
|---|---|
| 4-Chloro-Banzaldehyde | 56 g |
| Acetic Anhydride | 70 cc |
| Glacial Acetic Acid | 35 cc |

Stirred under reflux for 15 hours, poured on to water with vigorous stirring, filtered, washed with very hot water followed by hexane, air dried yellow solid.
Yield: 68 g.

EXAMPLE 12

Condensation of N-2-Dimethoxy-ethyl-N'-Methyl-Acetamido-4-[3-4-Dioxymethylenestyryl]-Pyridinium-Chloride with Gohsenol GH 23 [PVOH]

| Boiling water | 400 cc |
|---|---|
| To the above, added the following with vigorous stirring: Gohsenol GH 23 | 22.0 g |
| When a complete solution had formed, and the temperature had fallen to about 70° C., added the following: Conc HCl | 1.5 g |
| Immediately followed by: N-2-Dimethoxy-ethyl-N'-Methyl-Acetamido-4-[3-4-Dioxymethylenestyryl]-Pyridinium-Chloride | 2.4 g |

A clear yellow solution quickly formed, [PH<2], continued stirring at 65°-75° C. for 7 hours, allowed to cool, and added water to give an approximately 10% w/w solution.

The solution so formed was coated on to 230 white polyester mesh, dried, and exposed through a line positive to 5,5-unit steps [a unit being approximately 1.2 seconds] on a table top VNH fluorescent tube exposure unit. A good image formed after an easy washout. All steps adhered to the fabric.

I claim:

1. A photosensitive polymer composition comprising a compound of the structure

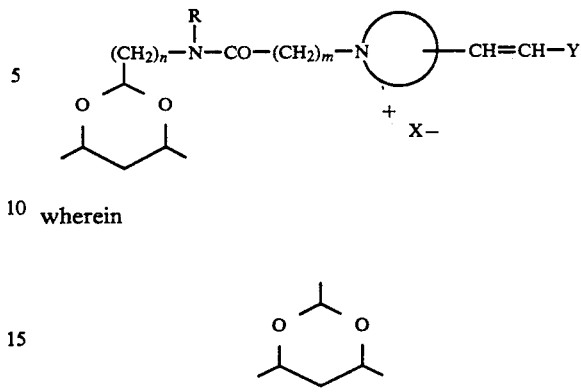

wherein

is a polyvinyl acetal,
n is an integer from 1 to 6,
R is hydrogen or alkyl,
m is an integer from 1 to 6,
X is an anion, is a divalent radical having the structure

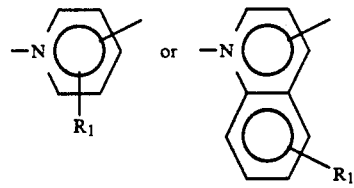

Y is a monovalent radical having the structure

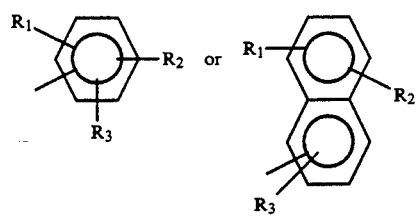

and more particularly, Y=phenyl and naphthyl unsubstituted or substituted with hydrogen, alkyl, alkenyl, alkoxy, aralkyl, and $R_1$, $R_2$, $R_3$ and $R_4$ are hydrogen, alkyl, alkenyl, alkoxy, aralkyl, substituted alkyl, substituted alkoxy, carboxy, carboxy ester, amino, substituted amino, amido, substituted amido, cyano, hydroxy, nitro, isocyanato, sulphonyl halide, and may be the same or different, or $R_1$ taken together with $R_2$ is methylenedioxy.

2. The photosensitive polymer composition according to claim 1, which comprises two or more of said compounds.

3. The polymer composition according to claims 1 or 2, which contains as a non-light sensitive group, at least one compound containing a formyl or acetal entity.

4. The polymer composition according to claim 3, wherein the last mentioned compound is acetaldehyde, dimethyl acetal, acetaldehyde diethyl acetal, chloral, chloroacetaldehyde dimethyl acetal, chloroacetaldehyde diethyl acetal, methylaminoacetaldehyde dimethyl acetal, 4-dimethylamino benzaldehyde, sulfo benzaldehyde or glyoxyllic acid.

5. The polymer composition according to claim 4, having an absorption spectrum in the range 320–700 nm.

6. The polymer composition according to claim 5, wherein a photosensitive salt group is present at a concentration of from about 0.5–20 mol % based on the polyvinyl alcohol in the composition.

7. The polymer composition according to claim 6, wherein at least one component selected from pigments, fillers, latex emulsions, plasticisers and resins is also present.

8. The composition according to claim 1, wherein m is 1–3.

9. The composition according to claim 8, wherein m is 1.

10. The composition according to claim 9, wherein n is 1.

11. The composition according to claim 10, wherein X is chloro.

12. The composition according to claim 11, wherein

is

* * * * *